United States Patent [19]

Whitlock et al.

[11] Patent Number: 4,736,087

[45] Date of Patent: Apr. 5, 1988

[54] PLASMA STRIPPER WITH MULTIPLE CONTACT POINT CATHODE

[75] Inventors: Michael G. Whitlock, Vallejo; Kevin C. Lettire, Santa Clara, both of Calif.

[73] Assignee: Olin Corporation, Cheshire, Conn.

[21] Appl. No.: 2,583

[22] Filed: Jan. 12, 1987

[51] Int. Cl.$^4$ ................................................ B23K 9/00
[52] U.S. Cl. ...................... 219/121 PG; 219/121 PD; 219/121 PR; 156/646; 156/345
[58] Field of Search ............ 219/121 PD, 121 PE, 219/121 PG, 121 PM, 121 PR; 204/164, 192; 156/345, 646, 643

[56] References Cited

U.S. PATENT DOCUMENTS

| | | | |
|---|---|---|---|
| 4,342,901 | 8/1982 | Zajac | 219/121 PD |
| 4,431,898 | 2/1984 | Reinberg et al. | 219/121 PG |
| 4,550,239 | 10/1985 | Uehara et al. | 219/121 PG |
| 4,550,242 | 10/1985 | Uehara et al. | 219/121 PG |
| 4,572,759 | 2/1986 | Benzing | 156/345 |
| 4,585,920 | 4/1986 | Hoog et al. | 219/121 PR |
| 4,657,616 | 4/1987 | Benzing et al. | 156/345 |

*Primary Examiner*—M. H. Paschall
*Attorney, Agent, or Firm*—Ralph D'Alessandro; Thomas P. O'Day

[57] ABSTRACT

An improved plasma stripping apparatus with external electrodes is provided wherein the cathode has multiple small area contact points adjacent and in close proximity to or uniformly touching the reactor chamber to cause areas of high r.f. field densities that enhance the gas breakdown in the plasma to obtain high rate film removal.

22 Claims, 3 Drawing Sheets

PLASMA STRIPPER WITH MULTIPLE CONTACT POINT CATHODE

BACKGROUND OF THE INVENTION

This invention deals generally with plasma film removal on semiconductor devices and, more specifically, with an improved design for a cathode utilizing multiple contact areas that is external to the reaction chamber.

Plasma processing techniques for patterning or depositing thin films on work pieces, such as semiconductor wafers, have been utilized for approximately 20 years. Plasma was first utilized in semiconductor processing for photoresist stripping. The development of very large scale integrated (VLSI) devices has been a more recent catalyst that has prompted further refinements in plasma techniques and processes.

Batch systems, in which large numbers of wafers are dry etched or stripped in an apparatus at one time, have been used commercially to process semiconductor devices for a number of years. Typical of these systems is the barrel type of reactor or etcher that is so named because of the reactor's shape. Barrel systems are volume-loaded and can accommodate many wafers. They have been used primarily for photoresist stripping. However, they generally do not provide a high degree of etching precision or etch uniformity.

An alternative to batch systems is the use of single wafer etchers or strippers. Initial single wafer etchers operated at low pressures and suffered from a relatively slow etch rate, which is the removal rate of a material at a specified location on the wafer surface. As the semiconductor industry matured, however, a trend developed toward using larger size wafers with greater pattern density. These larger wafers are more valuable and have become increasingly more desirable. However, larger size wafers require closer process control during etching or stripping operations.

Single wafer etchers or strippers also have been found to be better suited than batch systems for automation, such as the automatic loading or robotic loading of the individual wafers. Compared to batch systems, single wafer etchers or strippers can be more compact, occupying less space. However, most previous single wafer systems suffered from the aforementioned slow etch rate and from microcontamination problems.

Contamination frequently occurred in the prior low pressure, high power density plasma strippers primarily because of the use of internal metal electrodes. This type of a system developed plasmas, such as oxygen, which generated high D.C. bias levels on the cathode and produced high oxygen ion energy levels. Upon collision with the metal electrodes, typically formed of aluminum, the high energy level oxygen ions caused the electrodes to sputter, with some of the sputtered electrode material landing on the wafer. Where aluminum was used as the material of the electrode, an aluminum oxide film or oxidized aluminum particles were present as contaminants.

Elevated wafer temperatures due to processing in prior single wafer stripping systems also presented the problem of mobile ion and impurity migration. In this instance mobile ions, for example sodium ions, in the photoresist migrate from the photoresist through the silicon dioxide films to the silicon dioxide - silicon interface or through the patterned film to the film's interface with the underlying structure. This latter phenomenon produces unacceptable electrical characteristics when such wafers are used in integrated circuits.

These problems are solved or substantially reduced in the design of the single wafer photoresist plasma stripper of the present invention.

SUMMARY OF THE INVENTION

It is an object of the present invention to provide a single wafer photoresist plasma stripper that can operate at high pressure to obtain high rate film removal.

It is another object of the present invention to provide a single wafer photoresist plasma stripper that can generate high radio frequency field densities with enhanced gas breakdown in the plasma.

It is a feature of the present invention that electrodes external to the reaction chamber are provided.

It is another feature of the present invention that the external cathode employed in the plasma stripper uses multiple small area contact points adjacent the quartz reactor chamber to increase the radio frequency field density within the chamber.

It is still another feature of the present invention that the single wafer photoresist stripper operates at high pressure.

It is yet another feature of the present invention that the external anode acts as a ground band that is positioned below the cathode and above the level of the wafer.

It is an advantage of the present invention that the single wafer photoresist stripper achieves fast stripping rates.

It is another advantage of the present invention that fewer impurities and microcontaminants are introduced into the reactor chamber and, therefore, potentially onto the wafer.

It is another advantage of the present invention that the majority of the plasma generated is confined to the top portion of the reactor chamber.

It is still another advantage of the plasma stripper of the present invention that single wafer stripping with reproducible etching uniformity and precision is obtained.

These and other objects, features and advantages are obtained in a single wafer photoresist plasma stripper that operates at high pressure utilizing a quartz reaction chamber with an external anode and an external cathode that employs multiple small area contact points adjacent and about the exterior of the reaction chamber in close proximity or uniformly touching the reactor. This external cathode design creates areas of high radio frequency field densities that cause enhanced gas breakdown in the plasma producing high rates of film removal.

BRIEF DESCRIPTION OF THE DRAWINGS

The advantages of this invention will become apparent upon consideration of the following detailed disclosure of the invention, especially when it is taken in conjunction with the accompanying drawings wherein.

DETAILED DESCRIPTION OF THE PREFERRED EMBODIMENT

Figure 1:
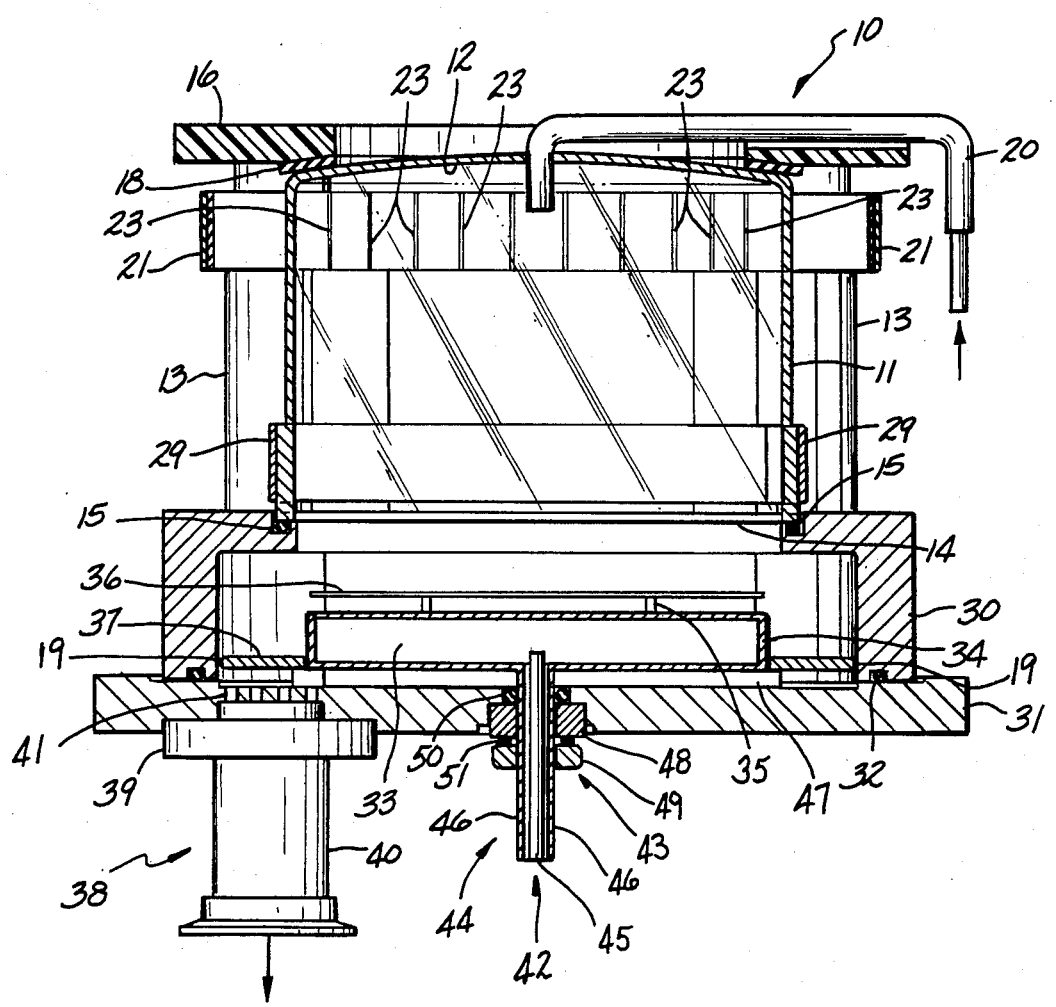
FIG. 1 is a front elevational sectional view of the single wafer photoresist plasma stripper.

FIG. 1 shows a sectional view in side elevation of the plasma stripper, indicated generally by the numeral 10. The stripper includes a quartz reactor chamber 11 that has an open bottom 14 and a domed top 12. The bottom 14 of the chamber is effectively sealed and seated on base 30 by the use of a seal 15, such as an O-ring or gasket, that fits in a groove about the base 30. A fiberglass retaining ring 16 extends about the periphery of the top of the quartz chamber 11 which, with the assistance of an underlying rubber pad 18, serves to retain the chamber 11 in place.

Oxygen infeed line 20 is seen entering through the domed top 12 of the chamber 11. Oxygen is supplied to the interior of the chamber 11 through the infeed line 20 from an oxygen supply source (not shown) that provides a flow of oxygen at approximately 100 standard cubic centimeters per meter (sccm) to 5 standard liters per minute (slpm). Oxygen is the main gas which is utilized in the stripping plasma. Industrial grade oxygen is routinely used for stripping operations, the small quantities of water and nitrogen present as impurities having a catalytic effect on the production of monatomic oxygen. Where films other than photoresists are being removed in the chamber 11, gases such as carbon tetrafluoride and sulfur hexafluoride may be used.

The stripper 10 utilizes two external electrodes that are annular in shape and circumscribe the outer cylindrical portion of chamber 11. The cathode 21 is located near and below the domed top 12 of the chamber 11, while anode 29 is located near the bottom 14 of the chamber 11 but above the level of the workpiece. Both the cathode 21 and the anode 29 are preferably formed from aluminum, but can be made of any appropriate conductor, such as copper, silver or platinum. The anode is connected to ground through the matching network (not shown) and is positioned above the level of the wafer 36. The cathode 21 is connected to a radio frequency power source (not shown) to provide the energy that ionizes the oxygen gas and generates the plasma. The cathode design will be discussed in greater detail subsequently.

The reactor chamber base 30, which is preferably formed of anodized aluminum, sits atop an anodized base plate 31, which is not anodized where it meets base 30. Base 30 is sealed by an O-ring seal 32 that fits within a slotted groove extending about the bottom periphery of base 30. Within the chamber base 30 is a wafer support means or chuck 34 that has a plurality of quartz pins 35 extending upwardly therefrom. Chuck 34 can be formed of aluminum, anodized aluminum or quartz. A workpiece, normally a wafer 36, rests on top of the quartz pins 35.

A workpiece, such as a wafer 36, is automatically loaded into the reactor chamber 11 from any one of the commercially available wafer cassettes that meets the standards of the Semiconductor Equipment Manufacturers Institute to sequentially and individually feed the plurality of wafers 36. The cassette (not shown) is mounted on an appropriate elevator, such as a Cybec elevator, which is used for Z or vertical motion indexing of the wafers. Lateral or X and Y motion, including loading and unloading of the reactor chamber 11, is accomplished through the use of a Brooks Orbitron ® loader (also not shown). This particular type of a loader extends into the cassette to lift a wafer 36 gently clear from the cassette with approximately ⅛ inch of vertical or Z motion. It then retracts the wafer 36 to a rotational point or home position. At this point a 90 degree rotation in the horizontal plane occurs. The loader then extends through a hinged door assembly (not shown) in the side of the chamber base 30 and gently places the wafer 36 on the plurality, preferably three, of quartz pins 35 with a downward vertical motion of about ⅛ inch. The loader then retracts from the chamber 11 through the hinged door assembly to the home rotational position. The hinged door assembly uses any appropriate mechanism to operate it, such as a solenoid, stepper motor or a pneumatic cylinder. Unloading of the chamber 11 is merely the reverse sequence of events of the load cycle, with the wafer 36 being returned to the same slot in the cassette from which it was removed.

A vacuum assembly, indicated generally by the numeral 38, is connected to extend through the anodized base plate 31 within the chamber base 30. This vacuum assembly is connected to a vacuum pump (not shown) that is capable of moving approximately 30 cubic feet of gas per minute via an exhaust conduit 40 that connects and extends into the anodized base plate 31. The vacuum assembly 38 evacuates product and unused reactant gases from the reactor chamber 11. A flange 39 connects the exhaust conduit 40 to the anodized base plate 31 through a seal (not shown).

An anodized aluminum baffle ring 37 creates a uniform pressure region beneath it to provide uniform exhausting by the vacuum pump of the product and unused reactant gases. Baffle ring 37 has a small gap 19 between its outer periphery and the innerwall of the reactor chamber base 30. The gap 19 extends about the entire periphery of baffle ring 37 to provide a uniform low pressure channel below it due to the flow restriction caused by the size and depth of gap 19.

A temperature control fluid circulation system, indicated generally by the numeral 44, is shown extending through the anodized aluminum base plate 31 into the wafer support chuck 34. This system 44 is used to control the temperature of the support chuck by circulating cooling fluid through the cavity 33 in the hollow chuck 34 at a rate of approximately two gallons per minute. The cooling fluid, for example water, enters the chuck cavity 33 through an inlet pipe 45 and exits through the concentrically encircling outlet pipe 46.

Outlet pipe 46, which is welded to the chuck 34, utilizes the quartz insulating disk 47 and the insulating vacuum feed through clamp assembly, indicated generally by the numeral 43, to seal the chuck against the anodized aluminum base plate 31. The quartz insulating disk 47 electrically isolates the chuck 34 from the base plate 31. Clamp assembly 43 includes an O-ring seal 50, that seats against the bottom of quartz insulating disk 47 and sealing boss 48, which is formed of an insulating material preferably such as acetal plastic or other suitable organic polymers. A sealing C-clamp 49 is secured in place to the outlet pipe 46 and then uses the allen screws 51 to preload the sealing boss 48 against the O-ring seal 50 and at the same time pulls the chuck 34 down onto the quartz insulating disk 47.

Figure 2:
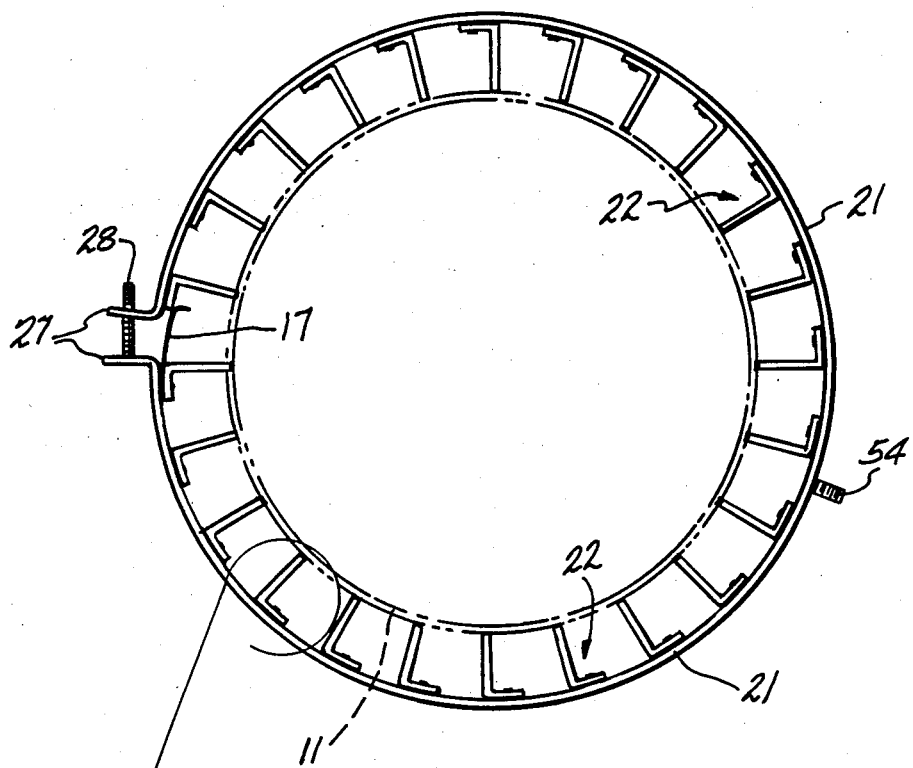
FIG. 2 is a top plan view of the cathode of the single wafer photoresist plasma stripper showing the extensions of the cathode that form the multiple small area contact points adjacent the quartz reactor chamber, whose location is shown by the phantom lines.

FIG. 2 shows the relationship of the multiple point cathode 21 with the quartz reactor chamber 11. The reactor chamber 11 is shown in dotted lines about the interior of the aluminum cathode 21. Cathode 21 is a plurality of cathode extensions, indicated generally by the numeral 22, that terminate in close proximity to or contact or touch the reactor chamber 11. The plurality of extensions 22 can best be seen in FIG. 3 as L-shaped.

Figure 3:
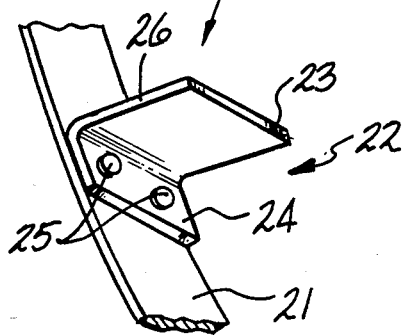
FIG. 3 is an enlarged side perspective view of one of the extensions of the cathode that form the multiple small area contact points adjacent the reactor chamber.

The L-shaped extensions 22 that serve as the contact points for the cathode 21 comprise a base section 24 and an extension portion 26, shown in FIG. 3. The L-shaped extensions 22 are appropriately fastened to the cathode, such as by welding or rivets 25. As is best seen in FIG. 2, the portion 26 of the L-shaped extensions 22 extend so the extreme end portion is in close proximity to or contacts the reactor chamber 11. The extensions, as shown, are generally perpendicular to the cathode 21 and the base portion 24 and terminate in a contact surface area 23 that either contacts the reactor chamber 11 or is in close proximity to it.

Figure 4:
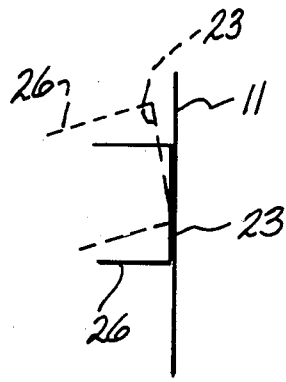
FIG. 4 is an enlarged side elevational view of one of the extensions of the cathode showing in solid lines the contact surface area of the extension substantially parallel to the outer wall of the chamber and showing in phantom lines the contact surface area of the extension in intersecting relationship to the outer wall of the chamber.

The contact surface area 23 preferably is parallel to the outer wall of reactor chamber 11, either in close proximity to it or uniformly touching it, as seen by the solid line drawings in FIG. 4. However, the contact surface area 23 could also be in an intersecting relationship with the outer wall of chamber 11, as illustrated by the phantom lines in FIG. 4, provided the power density per unit contact surface area is designed so that it does not degrade the wall of the reactor chamber 11 due to dielectric loss. Preferably the surface contact area 23 is flat, but it could equally well have other geometries, such as pointed or arcuate. Where the contact surface areas 23 are in close proximity to the outer wall of the chamber 11, non-conductive spacers, such as material sold under the trademark TEFLON, may be used to insure uniform spacing between the ends of the cathode extensions 22 and the sidewall of the reactor chamber 11.

The cathode 21 is fastenable about the chamber 11 and is retained in position by use of a retaining screw 28 through the flanges 27, as seen in FIG. 2. A conducting bar 17 spans the two extensions 22 adjacent the flanges 27 to ensure uniform transmission of the r.f. energy across the cathode 21 in the area of the flanges 27. A screw lead 54 connects the cathode 21 to the r.f. matching network (not shown).

Figure 5:
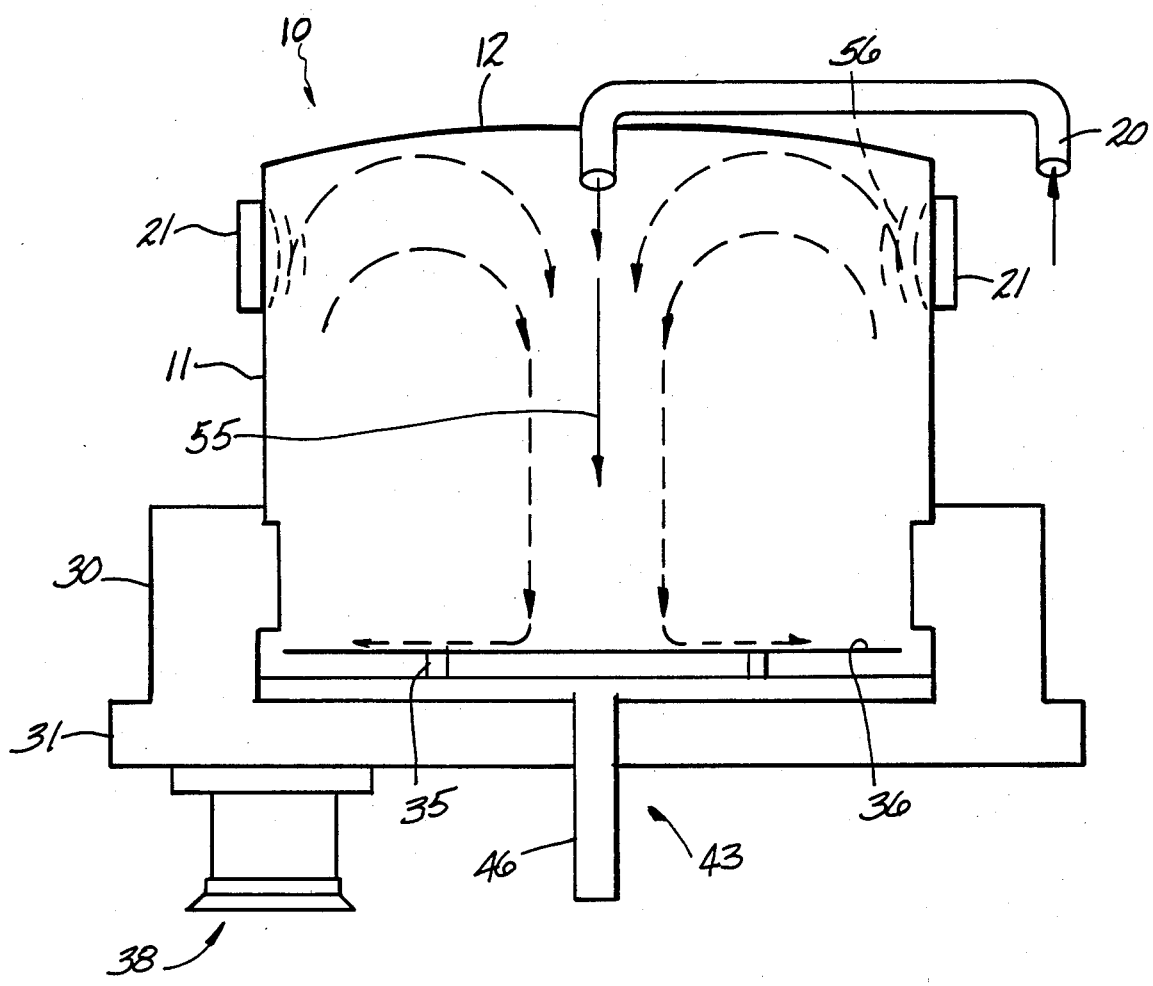
FIG. 5 is a diagrammatic illustration of the reactor chamber of single wafer photoresist plasma stripper showing the generally vertical downward uninterrupted flow of the reactant gases onto the wafer and the resulting flow pattern within the chamber of the active stripping gas species.

FIG. 5 shows a diagrammatic illustration of the flow pattern of reactant gases and active species within the chamber 11 that produce the flow paths and velocities that help to accomplish the increased rate of stripping of film from the wafer 36. Oxygen is fed into the chamber 11 through the domed top 12 so that it enters in an uninterrupted substantially vertically downward flow path 55 onto the workpiece or wafer 36. The flow rate of the reactant gases, primarily oxygen for photoresist removal, is preferably about 2 to about 3 slpm.

The cathode 21 is connected to a high frequency power supply operating at approximately 13.56 MHz frequency that is coupled to the cathode through an impedance matching unit. The matching unit (not shown) matches the impedance, typically 50 ohms, of the r.f. generator, which includes an oscillator and power amplifier, to the impedance of the reactor chamber to maximize the power transferred to the cathode 21 and to minimize the power reflectance. The stripper 10 is supplied with from about 100 to about 650 watts during operation. The cathode, because of the multiple small area contact points in contact with or adjacent the chamber 11, creates a high strength plasma field near the top of the chamber that remains confined to the area near the top of the chamber 11 because of the high pressure, normally from about 1 to about 7 torr, at which the stripper 10 is operated. Since the powered electrode (cathode) area in contact with or adjacent to the chamber 11 is much less than the area of the grounded (anode) electrode area in contact with or adjacent to the chamber 11, there is less ion density at the bottom of the chamber 11 in the area just above the workpiece or wafer 36. The high intensity plasma is located in the area 56 adjacent the multiple small area contact points.

The uninterrupted substantially vertically downward flow path 55 (see FIG. 5) of the reactant gases, primarily oxygen, into and through the chamber 11 creates a type of internal flow pattern within the chamber 11 that is thought to be governed by the Bernoulli Effect, pulling the oxygen species generated by the high intensity plasmas away from the walls of the chamber down toward the workpiece or wafer 36. The flow pattern of these species is illustrated by the phantom arrows in FIG. 5. These oxygen species, typically monatomic oxygen and molecular oxygen in its excited state, spectroscopically notated as $O_2('\Sigma^+g)$ and about 36.2 kilocalories above the ground state, are the most important for the chemical reaction required to strip away the photoresist film at a high rate. This flow pattern drags or pulls these species down to the workpiece faster by creating an area of high pressure along the uninterrupted substantially vertically downward flow path 55 and low pressure areas adjacent the path 55 into which are pulled and within which flow these desired oxygen species.

The high pressure at which the stripper 10 is operated also forces the recombination of the ions of the partially ionized reactant gases to occur in a small area near the top of the reactor chamber 11 because of the reduced mean free path of the ions in this area. This also produces the positive effect of reducing the number of ions at the bottom of the chamber near the workpiece or wafer 36, where the presence of such ions with their mass and velocity would damage the workpiece 36 and the films on the workpiece upon collision.

These velocities, power levels, field densities and flow patterns combine to produce a stripper 10 that is capable of stripping about a 1.2 to about a 1.5 micron thick positive photoresist film from a semiconductor wafer 36 at a strip rate of about 1.5 to about 3.0 microns per minute. The high oxygen flow rate in the chamber 11, in addition to providing sufficient reagent to permit the stripping to occur at these rates at the specified field strength and power densities, helps to some degree to cool the workpiece or wafer 36. Further, the design and these operating parameters of the stripper keep the temperature of the reactor base between about 17° C. and 40° C. to ensure reproduceable results and to stay within the operating constraints of the equipment and materials utilized.

In operation, 100 millimeter diameter silicon substrates or wafers 36 with about a 1.5 micron thick Hunt Positive Photoresist 204 were fed sequentially by a Brooks Orbitron ® loader into the reactor chamber 11 from a cassette. The cathode 21 was operated at 13.56 MHz at about 500 watts. Oxygen was fed into the chamber 11 through the oxygen infeed line 20 at about 2.75 slpm down onto the wafers 36 in a substantially vertically downward uninterrupted flow path and the chamber 11 was pressurized to about 5 torr. The final temperature of the wafers in the chamber 11 was about 230° C. The photoresist was stripped from the wafer at etch rates which changed as the temperature of the wafers 36 and, to a lesser degree, the reactor chamber 11 changed. The etch rates were functions of time, with the etch rate reaching about 2.0 microns per minute for the first 20 seconds, about 2.4 microns per minute for the next 10 seconds and about 2.7 microns per minute for about the last 5 seconds of etching. At the conclusion of the stripping process, the wafer was removed by the Orbitron loader and replaced in the cassette.

While the preferred structure in which the principles of the present invention have been incorporated is shown and described above, it is to be understood that the invention is not to be limited to the particular details thus presented, but in fact, widely different means may be employed in the practice of the broader aspects of this invention. The apparatus could also be used for dry processing removal of organic films, including polysilicon or silicon nitride, or organic contaminants from semiconductor wafers, as well as optical lenses, mirrors, ceramics and metallic coatings. The scope of the appended claims is intended to encompass all obvious changes in the details, materials and arrangement of parts which will occur to one of skill in the art upon a reading of the disclosure.

What is claimed is:

1. An apparatus for the dry plasma processing of a single workpiece, comprising in combination:
   (a) a quartz reactor chamber for generating plasma having a generally cylindrical central wall portion with a top half and a bottom half, an open-bottom and a closed top;
   (b) base means for supporting the reactor chamber, the base means being contactable with the open-bottom;
   (c) sealing means between the reactor chamber and the base means for sealing the reactor chamber;
   (d) gas inlet means for feeding a reactant gas into the reactor chamber;
   (e) a cathode externally positioned about the top half of the cylindrical central wall portion of the reactor chamber adjacent and below the closed top, the cathode being connectable to a radio frequency power source, the cathode further being generally circular and having a plurality of contact points in close proximity to and extending inwardly toward the reactor chamber to create radio frequency fields of high density;
   (f) support means connected to the base means for receiving a workpiece;
   (g) an anode externally positioned about the bottom half of the central wall portion of the reactor chamber adjacent and above the open-bottom and above the support means, the anode being electrically grounded;
   (h) vacuum means for evacuating the reactor chamber; and
   (i) cooling means for controlling the temperature of the support means.

2. The apparatus according to claim 1 wherein the sealing means is an O-ring.

3. The apparatus according to claim 1 wherein the plurality of contact points further comprise extensions from the cathode.

4. The apparatus according to claim 3 wherein the extensions are evenly spaced apart about the central portion of the reactor chamber.

5. The apparatus according to claim 4 wherein the extensions are generally perpendicular to the cathode.

6. The apparatus according to claim 5 wherein the extensions are L-shaped.

7. The apparatus according to claim 1 wherein the cathode is aluminum.

8. The apparatus according to claim 1 wherein the anode is aluminum.

9. The apparatus according to claim 1 wherein the wafer support means further comprise a plurality of quartz pins upon which rests the workpiece.

10. The apparatus according to claim 9 wherein the workpiece is further a semiconductor wafer.

11. The apparatus according to claim 9 wherein the cooling means further comprises a circulating water system that circulates water into and out of the support means.

12. The apparatus according to claim 1 wherein the gas inlet means feeds the reactant gases in an uninterrupted substantially vertically downward flow path toward the workpiece.

13. The apparatus according to claim 12 wherein the plasma generated within the reactor chamber includes active oxygen species that work on the workpiece.

14. The apparatus according to claim 13 wherein the uninterrupted substantially vertically downward flow path creates an internal flow pattern within the reactor chamber that pulls the active oxygen species away from the central wall portion of the chamber down toward the workpiece.

15. The apparatus according to claim 1 wherein the plurality of contact points contact the reactor chamber.

16. An apparatus with a reactor chamber for the dry plasma processing of a single workpiece positioned adjacent the bottom of the chamber, the chamber further having a cylindrical wall with a top half and a bottom half and a domed top and a gas inlet means for feeding a reactant gas through the domed top into the chamber, the improvement comprising in combination:
   (a) a cathode externally positioned about the top half of the cylindrical wall of the reactor chamber adjacent and below the domed top, the cathode being connectable to a radio frequency power source and being circular with a plurality of contact points in close proximity to and extending inwardly toward the reactor chamber to create radio frequency fields of high density within the chamber which produce active gas species to work on the workpiece; and
   (b) an uninterrupted substantially vertically downward flow path of the reactant gas toward the workpiece that creates an internal flow pattern within the reactor chamber that pulls the active gas species away from the cylindrical wall portion of the chamber down toward the workpiece.

17. The apparatus according to claim 16 wherein the reactant gas includes oxygen.

18. The apparatus according to claim 17 wherein the active gas species include monatomic oxygen and molecular oxygen in its excited state.

19. The apparatus according to claim 16 wherein the plurality of contact points further comprise extensions from the cathode.

20. The apparatus according to claim 19 wherein the extensions are evenly spaced apart about the cylindrical wall.

21. The apparatus according to claim 20 wherein the extensions are generally perpendicular to the cathode.

22. The apparatus according to claim 16 wherein the plurality of contact points contact the reactor chamber.

* * * * *